US012626737B2

(12) United States Patent
Shenoy et al.

(10) Patent No.: US 12,626,737 B2
(45) Date of Patent: May 12, 2026

(54) TEMPERATURE BASED BLOCK READ

(71) Applicant: Sandisk Technologies, Inc., Milpitas, CA (US)

(72) Inventors: Manoj M. Shenoy, Bengaluru (IN); Arunkumar Mani, Bengaluru (IN); Arvind Sundaramoorthi, Krishnagiri (IN)

(73) Assignee: Sandisk Technologies, Inc., Milpitas, CA (US)

( * ) Notice: Subject to any disclaimer, the term of this patent is extended or adjusted under 35 U.S.C. 154(b) by 234 days.

(21) Appl. No.: 18/448,393

(22) Filed: Aug. 11, 2023

(65) Prior Publication Data

US 2024/0249755 A1     Jul. 25, 2024

Related U.S. Application Data

(60) Provisional application No. 63/440,839, filed on Jan. 24, 2023.

(51) Int. Cl.
*G11C 7/10*          (2006.01)
*G11C 7/04*          (2006.01)

(52) U.S. Cl.
CPC .............. *G11C 7/1069* (2013.01); *G11C 7/04* (2013.01); *G11C 7/1096* (2013.01)

(58) Field of Classification Search
CPC ....... G11C 7/1069; G11C 7/04; G11C 7/1096; G11C 11/5642; G11C 16/26; G11C 16/3418
USPC ....................................................... 365/158
See application file for complete search history.

(56) References Cited

U.S. PATENT DOCUMENTS

2022/0229580 A1*   7/2022   Palmer .................. G06F 3/0653

FOREIGN PATENT DOCUMENTS

CN              111831506 A   * 10/2020   .......... G06F 11/3058

* cited by examiner

*Primary Examiner* — Huan Hoang
(74) *Attorney, Agent, or Firm* — DENTONS Durham Jones Pinegar

(57) ABSTRACT

A solid-state memory device that performs temperature-based block reads includes an array of non-volatile memory cells and a controller. The controller is configured to track a temperature for a region of the array of non-volatile memory cells in response to data being written to the region. The controller is configured to determine a read voltage threshold for a read request for the region based on both the tracked temperature for the region and a temperature determined for the region in response to a read request. The controller is configured to perform a read operation for the region using the determined read voltage threshold.

20 Claims, 11 Drawing Sheets

100

Computing Device 110

| 111 | 112 | 114 | 113 |

Network
115

Storage Clients 116

| Operating System | File System | Database | ... |

Storage Client(s)
116

| Block I/O Interface 131 | SCM Interface 132 | Cache Interface 133 |

Logical Address Space 134

Metadata 135

Non-Volatile Memory Device Interface 139 | 150 |

Non-Volatile Memory Device 120 ⌇125

Voltage Determination Component 150

Non-Volatile Memory Media Controller 126 | 150 |

127

NV Memory Element(s) 123

NV Memory Media 122

| 150 | 150 | 150 | ...

Logical Memory Element 129

Non-Volatile Memory System 102

| 602 Write Temperature Ranges (Twrite) | Read Temperature Ranges(Tread) | | | | |
|---|---|---|---|---|---|
| | -25 - 0C | 1C - 25C | 26C - 50C | 51C - 75C | 76C - 85C |
| -25 - 0C | 0x04 | 0x00 | 0xF6 | 0xEC | 0xF4 |
| 1C - 25C | 0x00 | 0x00 | 0x00 | 0x00 | 0x00 |
| 26C - 50C | 0xF6 | 0x00 | 0x06 | 0xFC | 0xF0 |
| 51C - 75C | 0xEC | 0x00 | 0xFC | 0x08 | 0xEE |
| 76C - 85C | 0xF4 | 0x00 | 0xF0 | 0xEE | 0xEC |

702 — Track Temperature For Region

704 — Determine Read Voltage Threshold For Read Request

706 — Perform Read Operation For Region Using Read Voltage Threshold

Begin

End

800

TEMPERATURE BASED BLOCK READ

CROSS-REFERENCES TO RELATED APPLICATIONS

This application claims the benefit of U.S. Provisional Patent Application No. 63/440,839 entitled "TEMPERATURE BASED BLOCK READ" and filed on Jan. 24, 2023, for Manoj M. Shenoy et al., which is incorporated herein by reference.

TECHNICAL FIELD

The present disclosure, in various embodiments, relates to storage and/or memory devices and more particularly relates to temperature based block reads for storage and/or memory devices.

BACKGROUND

Memory devices may be organized into erase blocks or other regions of memory elements. Erase blocks may further be organized into pages, which are the smallest programmable unit physically made up of a row of cells linked on the same word line, or the like.

A fixed read voltage threshold or a fixed read voltage threshold shift from a baseline read voltage threshold may be used for all blocks; however, optimal read voltage thresholds may vary due to different conditions at read time and/or write time, and read retry processes that occur in response to data errors can be time consuming, drastically reducing performance.

SUMMARY

Various embodiments are disclosed, including apparatuses, systems, and methods for temperature based block reads. In some embodiments, an apparatus includes an array of non-volatile memory cells and/or a controller. The controller, in one embodiment, is configured to track a temperature for a region of the array of non-volatile memory cells in response to data being written to the region. In certain embodiments, the controller is configured to determine a read voltage threshold for a read request for the region based on both a tracked temperature for the region and a temperature determined for the region in response to the read request. The controller, in a further embodiment, is configured to perform a read operation for the region using the determined read voltage threshold.

A method, in one embodiment, includes recording write temperatures per block of a non-volatile memory as data is programmed to the non-volatile memory. In some embodiments, the method includes looking up a read voltage threshold shift for a read request based on both a recorded write temperature and a temperature determined in response to the read request. The method, in a further embodiment, includes reading data from the non-volatile memory using the read voltage threshold shift to satisfy the read request.

An apparatus, in one embodiment, includes means for sensing write temperatures for a non-volatile memory. The apparatus, in certain embodiments, includes means for sensing a read temperature for the non-volatile memory in response to a read request. The apparatus, in some embodiments, includes means for determining a read voltage threshold for the read request based on both a sensed write temperature and a sensed read temperature. The apparatus, in a further embodiment, includes means for reading data from the non-volatile memory using the determined read voltage threshold.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 1A is a schematic block diagram illustrating one embodiment of a system for temperature based block reads;

FIG. 6 is a schematic block diagram illustrating one embodiment of a reference table;

DETAILED DESCRIPTION

Figure 1B:
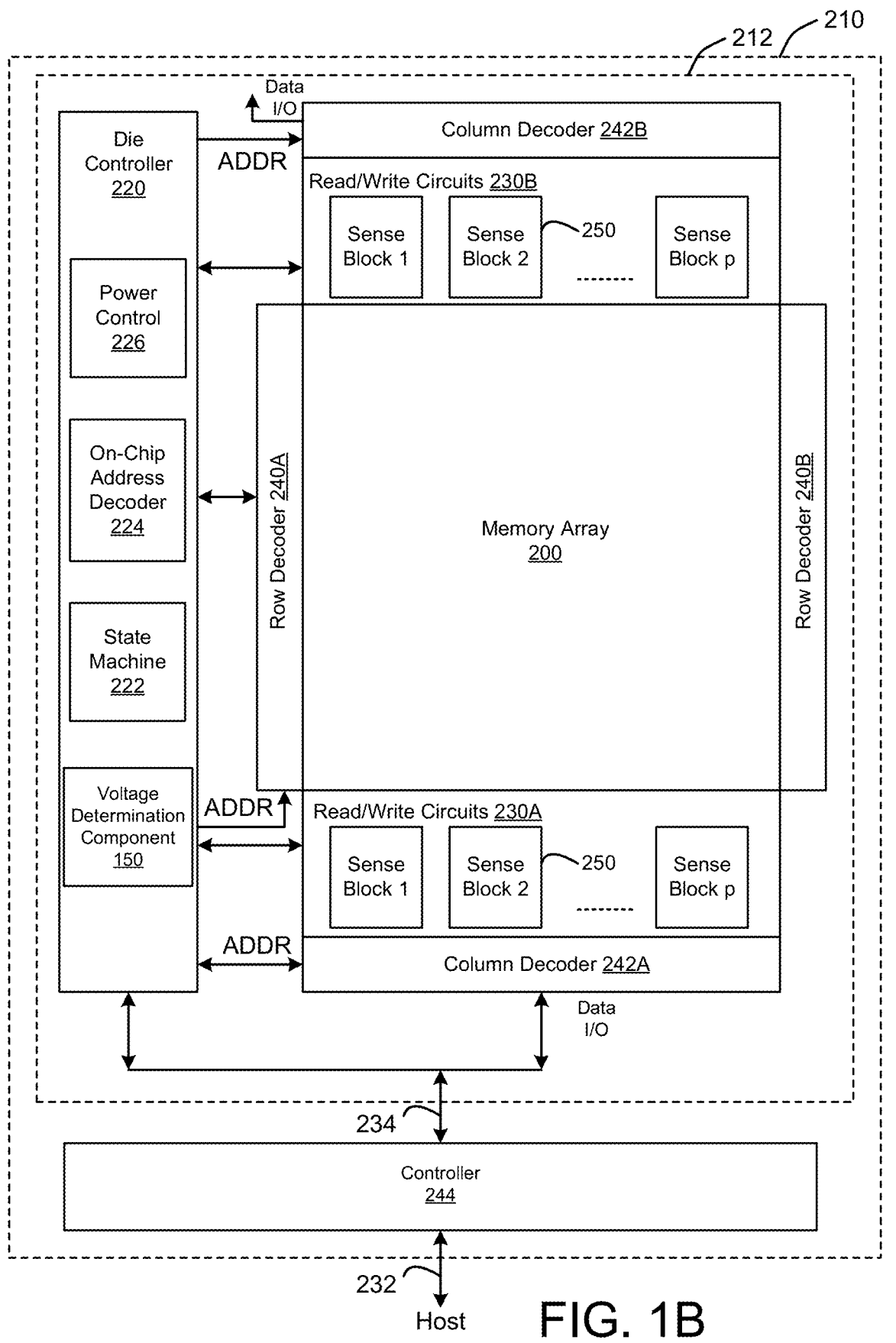
FIG. 1B is a schematic block diagram illustrating another embodiment of a system for temperature based block reads.

Aspects of the present disclosure may be embodied as an apparatus, system, method, or computer program product. Accordingly, aspects of the present disclosure may take the form of an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodiment on one or more non-transitory computer-readable storage media storing computer-readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer-readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

In addition, as used herein, the term "set" can mean "one or more," unless expressly specified otherwise. The term "sets" can mean multiples of or a plurality of "one or mores," "ones or more," and/or "ones or mores" consistent with set theory, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 including a voltage determination component 150 for a controller 126 of a non-volatile memory device 120. The voltage determination component 150 may be part of and/or in communication with a controller 126, a non-volatile memory element 123, a device driver, or the like. The voltage determination component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or controller 126 to a communication network 115, such as an Internet Protocol (IP) network, a Storage Area Network (SAN), a wireless network, a wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer-readable storage medium 114. The computer-readable storage medium 114 may comprise executable instructions configured to cause the computing device 110 (e.g., processor 111) to perform steps of one or more of the methods disclosed herein. Alternatively, or in addition, the voltage determination component 150 may be embodied as one or more computer-readable instructions stored on the non-transitory storage medium 114.

The non-volatile memory system 102, in the depicted embodiment, includes a voltage determination component 150. The voltage determination component 150, in one embodiment, is configured to determine a read voltage threshold and/or a read voltage threshold shift for an erase block or other region of memory. For example, a voltage determination component 150 may sense, track, and/or otherwise monitor write/program temperatures for erase blocks and/or other regions of the non-volatile memory medium 122. In response to a read request, a voltage determination component 150 may sense and/or otherwise determine a read temperature, and may determine a read voltage threshold to use for the read request based on both the write/program temperature and the read temperature.

In this manner, in some embodiments, a voltage determination component 150 may reduce the occurrences of read retries, reduce latency, or the like. A voltage determination component 150, in certain embodiments, may store tracked write/program temperatures for erase blocks or other regions of the non-volatile memory medium 122 in a minimal manner (e.g., minimizing other metadata stored with the tracked temperatures, or the like). For example, a voltage determination component 150 may store tracked write/program temperatures in an address mapping structure such as a global address table (GAT) or forward map that maps logical addresses to physical addresses, an inverse global address table (IGAT) or reverse map that maps physical addresses to logical addresses, or the like, with minimal other metadata (e.g., with only a single write/program temperature per erase block or other region, without any other temperatures for the same erase block or other region, without any time indicator such as a timestamp and/or time period associated with a tracked temperature, or the like). By tracking write/program temperatures per erase block or other region of the non-volatile memory medium 122 and also minimizing the storage of other metadata, in some embodiments, a voltage determination component 150 may efficiently determine read voltage thresholds and/or offsets, even when little volatile memory (e.g., RAM) is available, such as in automobiles or other embedded applications, removable USB devices, memory cards, or the like.

In one embodiment, the voltage determination component 150 may comprise logic hardware of one or more non-volatile memory devices 120, such as a controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the voltage determination component 150 may comprise executable software code, such as a device driver or the like, stored on the computer-readable storage medium 114 for execution on the processor 111. In a further embodiment, the voltage determination component 150 may include a combination of both executable software code and logic hardware.

In one embodiment, the voltage determination component 150 is configured to receive I/O requests from a device driver or other executable application via a bus 125 or the like. The voltage determination component 150 may be further configured to transfer data to/from a device driver and/or storage clients 116 via the bus 125. Accordingly, the voltage determination component 150, in some embodiments, may comprise and/or be in communication with one or more direct memory access (DMA) modules, remote DMA modules, bus controllers, bridges, buffers, and so on to facilitate the transfer of memory/storage requests and storage operations of associated program data. In another embodiment, the voltage determination component 150 may receive storage requests as an API call from a storage client 116, as an IO-CTL command, or the like.

According to various embodiments, a controller 126 in communication with one or more voltage determination components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more memory elements 123 of non-volatile memory media 122, which may include, but is not limited to: random access memory (RAM), resistive RAM (ReRAM), Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape, etc.), optical storage media, or the like, among other devices that are possible and contemplated herein. The one or more memory elements 123 of non-volatile memory media 122, in certain embodiments, comprise storage class memory (SCM).

While legacy technologies, such as NAND flash, may be block and/or page addressable, storage class memory, in one embodiment, is byte addressable. In further embodiments, SCM may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A controller 126 may be configured to manage data operations on the non-volatile memory media 122, and may comprise one or more processors, programmable processors (e.g., FPGAs), ASICs, micro-controllers, or the like. In some embodiments, the controller 126 is configured to store data on and/or read data from the non-volatile memory media 122, to transfer data to/from the non-volatile memory device 120, and so on.

The controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library.

A device driver may be further configured to provide a cache interface 133 for caching data using the non-volatile memory system 102. A device driver may further comprise a non-volatile memory device interface 139 that is configured to transfer data, commands, and/or queries to the controller 126 over a bus 125, as described above.

FIG. 1B illustrates an embodiment of a non-volatile storage device 210 that may include one or more memory die and/or chips 212. Memory die 212, in some embodiments, includes an array (e.g., two-dimensional (2D), three dimensional (3D), etc.) of memory cells, die controller 220, and read/write circuits 230A/230B. In one embodiment, access to the memory array 200 by various peripheral circuits is implemented in a symmetric fashion, on opposite sides of the array, so that the densities of access lines and circuitry on each side are reduced by half. The read/write circuits 230A/230B, in a further embodiment, can include multiple sense blocks 250 that allow a page of memory cells to be read and/or programmed in parallel.

The memory array 200, in various embodiments, is addressable using word lines via row decoders 240A/240B and using bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a voltage determination component 150, a state machine 222, and an on-chip address decoder 224. In one embodiment, the state machine 222 comprises at least a portion of the voltage determination component 150. In a further embodiment, the controller 244 comprises at least a portion of the voltage determination component 150. In various embodiments, one or more of the sense blocks 250 comprises at least a portion of the voltage determination component 150. The voltage determination component(s) 150 discussed with reference to FIG. 1B may be similar to the voltage determination component(s) 150 discussed with reference to FIG. 1A.

The state machine 222, in one embodiment, provides chip-level control of memory operations. The on-chip address decoder 224 provides an address interface to convert between the address that is used by the host or a memory controller to the hardware address used by the decoders 240A, 240B. 242A, and 242B. In certain embodiments, the state machine 222 includes an embodiment of the voltage determination component 150. The voltage determination component 150, in certain embodiments, is embodied as software in a device driver, hardware in a controller 244, and/or hardware in a die controller 220 and/or state machine 222. In one embodiment, one or any combination of die controller 220, voltage determination component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
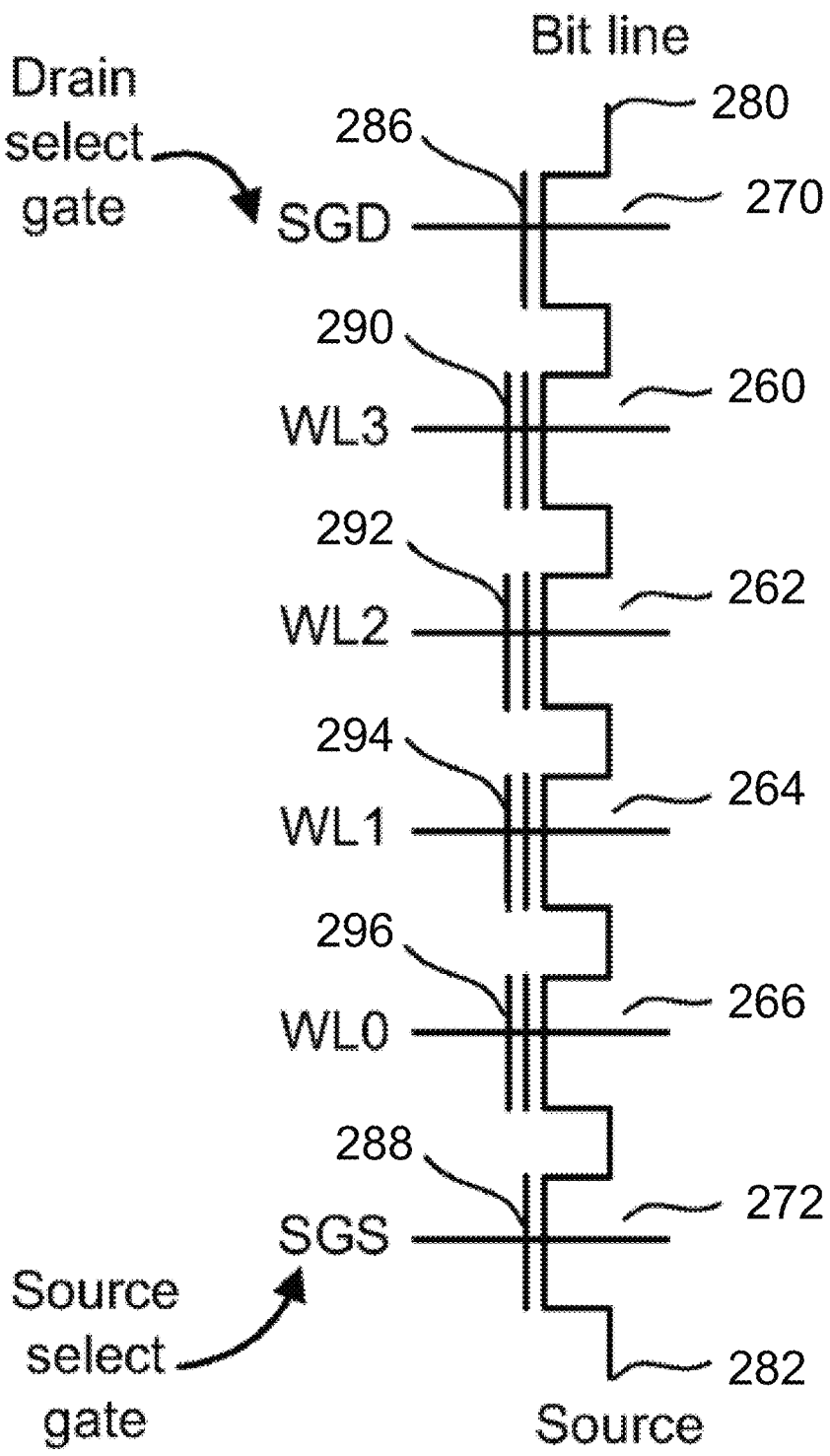
FIG. 2 is a schematic block diagram illustrating one embodiment of a string of memory cells.

FIG. 2 depicts one embodiment of a NAND string comprising a plurality of storage elements. The NAND string depicted in FIG. 2, in some embodiments, includes four transistors 260, 262, 264, and 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell 200. In some embodiments, a storage element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/memory cell 260, 262, 264, and 266 in the NAND string. The NAND string, in some embodiments, may include some storage elements 260, 262, 264, and 266 that have been programmed and some storage elements 260, 262, 264, and 266 that have not been programmed.

Figure 3A:
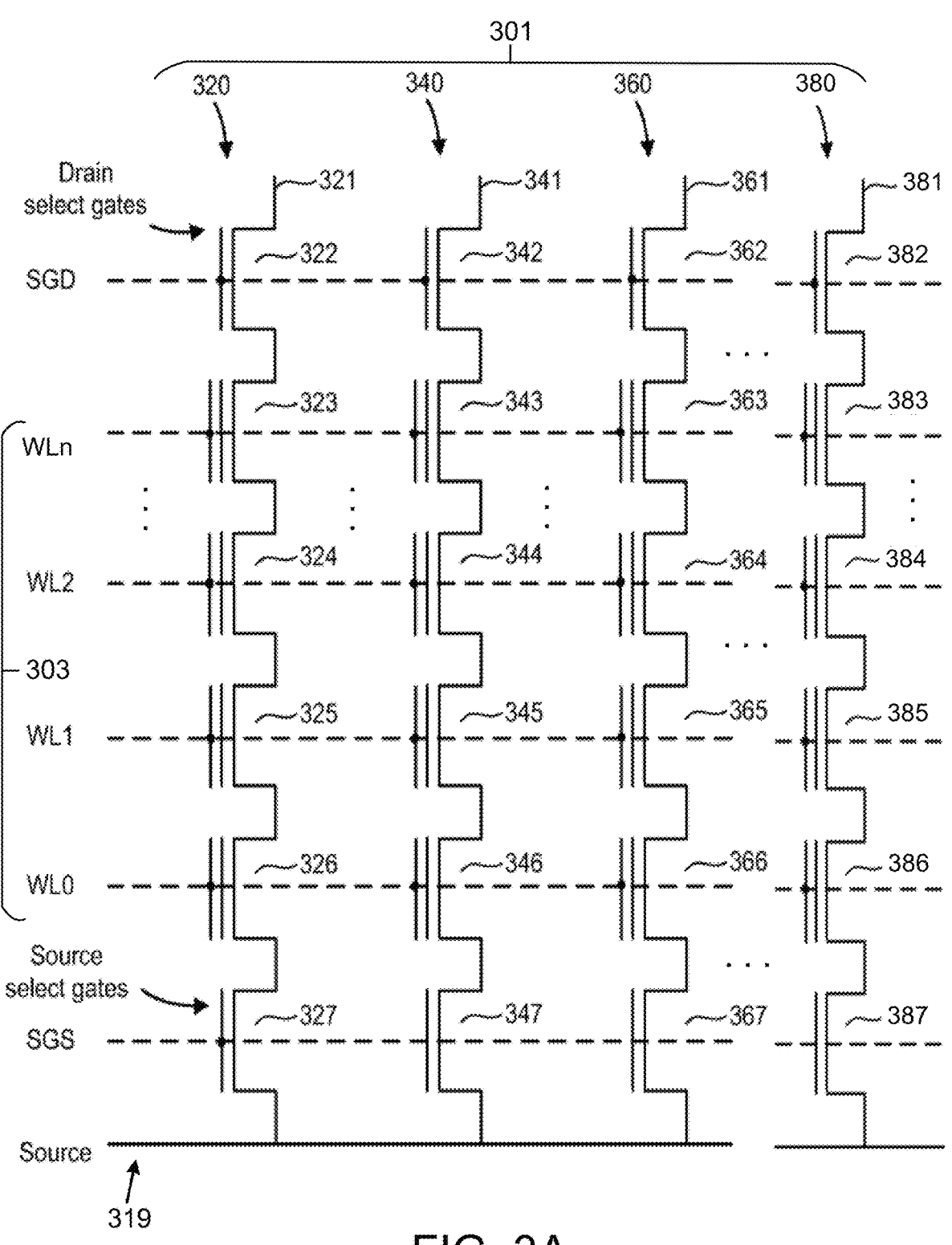
FIG. 3A is a schematic block diagram illustrating one embodiment of an array of memory cells.

FIG. 3A is a circuit diagram depicting a plurality of NAND strings 320, 340, 360, 380 (collectively 301). The architecture for a flash memory system using a NAND structure may include several NAND strings 301. For example, FIG. 3A illustrates NAND strings 301 in a memory array 200 that includes multiple NAND strings 301. In the depicted embodiment, each NAND string 320, 340, 360, 380 includes drain select transistors 322, 342, 362, 382, source select transistors 327, 347, 367, 387, and storage elements 323-326, 343-346, 363-366, 383-386. While four storage elements 323-326, 343-346, 363-366, 383-386 per NAND string 301 are illustrated for simplicity, some NAND strings 301 can include any number of storage elements (e.g., thirty-two, sixty-four, or the like storage elements, among other storage elements that are possible and contemplated herein).

NAND strings 301, in one embodiment, are connected to a source line 319 by source select transistors 327, 347, 367, 387. A selection line SGS may be used to control the source side select transistors. The various NAND strings 301, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 301; that is, different select lines can be provided for different NAND strings 301.

As described above, each word line WL0-WLn (collectively 303) comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines 303, in some embodiments, comprise the rows of the memory array 200, storage block, erase block, or the like. Each word line 303, in some embodiments, connects the control gates of each storage element 323-383, 324-384, 325-385, 326-386 in a row. Alternatively, the control gates may be provided by the word lines 303 themselves. In some embodiments, a word line 303 may include tens, hundreds, thousands, millions, or the like of storage elements 323-383, 324-384, 325-385, 326-386.

In one embodiment, the array of memory cells 323-326, 343-346, 363-366 illustrated in FIG. 3A may be an erase block, and the erase block may be written/programmed at one temperature, and read at a different temperature, may be written/programmed and/or read at a different temperature than one or more other erase blocks. In such an embodiment, the erase block or other region of memory may have different storage/voltage characteristics at some temperatures than others, or than other erase blocks that were written/programmed at different temperatures, or the like. Furthermore, the storage/voltage characteristics for erase blocks and/or other regions of memory may vary across different storage dies 212, or the like.

In some storage systems, a fixed read voltage shift may be used to compensate for voltage drifts, regardless of temperatures, and failed reads may be corrected by repeatedly retrying the read operation with different read voltage thresholds. However, using the same fixed read voltage shift may not be optimal at different temperatures and/or for different erase blocks or other regions of memory because of their different storage/voltage characteristics. For instance, memory cells 323-326, 343-346, 363-366 in different erase blocks or other regions programmed at different temperatures may have been programmed to different stored voltage levels due to the different temperatures, may have experienced different amounts of voltage drift, or the like, causing data read errors if read voltage thresholds are not adjusted. Accordingly, static or fixed read voltage threshold shifts may not properly compensate for different program/write and/or read temperatures.

In one embodiment, each storage element 323-326, 343-346, 363-366, 383-386 is configured to store data. For example, when storing one bit of digital data, the range of possible threshold voltages ("VTH") of each storage element 323-326, 343-346, 363-366, 383-386 may be divided into two ranges that are assigned logical data "1" and "0." In one example of a NAND type flash memory, the VTH may be negative after the storage elements 323-326, 343-346, 363-366, 383-386 are erased, and defined as logic "1." In one embodiment, the VTH after a program operation is positive and defined as logic "0."

When the VTH is negative and a read is attempted, in some embodiments, storage elements 323-326, 343-346, 363-366, 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, 326-386 may also store multiple levels of information, for example, multiple bits of digital data. In such an embodiment, the range of VTH value is divided into the number of levels of data. For example, if four levels of information can be stored in each storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, 383-386 and the threshold voltage ranges of the storage elements 323-326, 343-346, 363-366, 383-386 depends upon the data encoding scheme adopted for the storage elements 323-326, 343-346, 363-366, 383-386.

In some embodiments, portions of the storage elements 323-326, 343-346, 363-366, 383-386 may be defective. In such an embodiment, the voltage determination component 150 may manage which portions of the storage elements 323-326, 343-346, 363-366, 383-386 are used for operations, read voltage thresholds for the storage elements 323-326, 343-346, 363-366, 383-386, or the like.

Figure 3B:
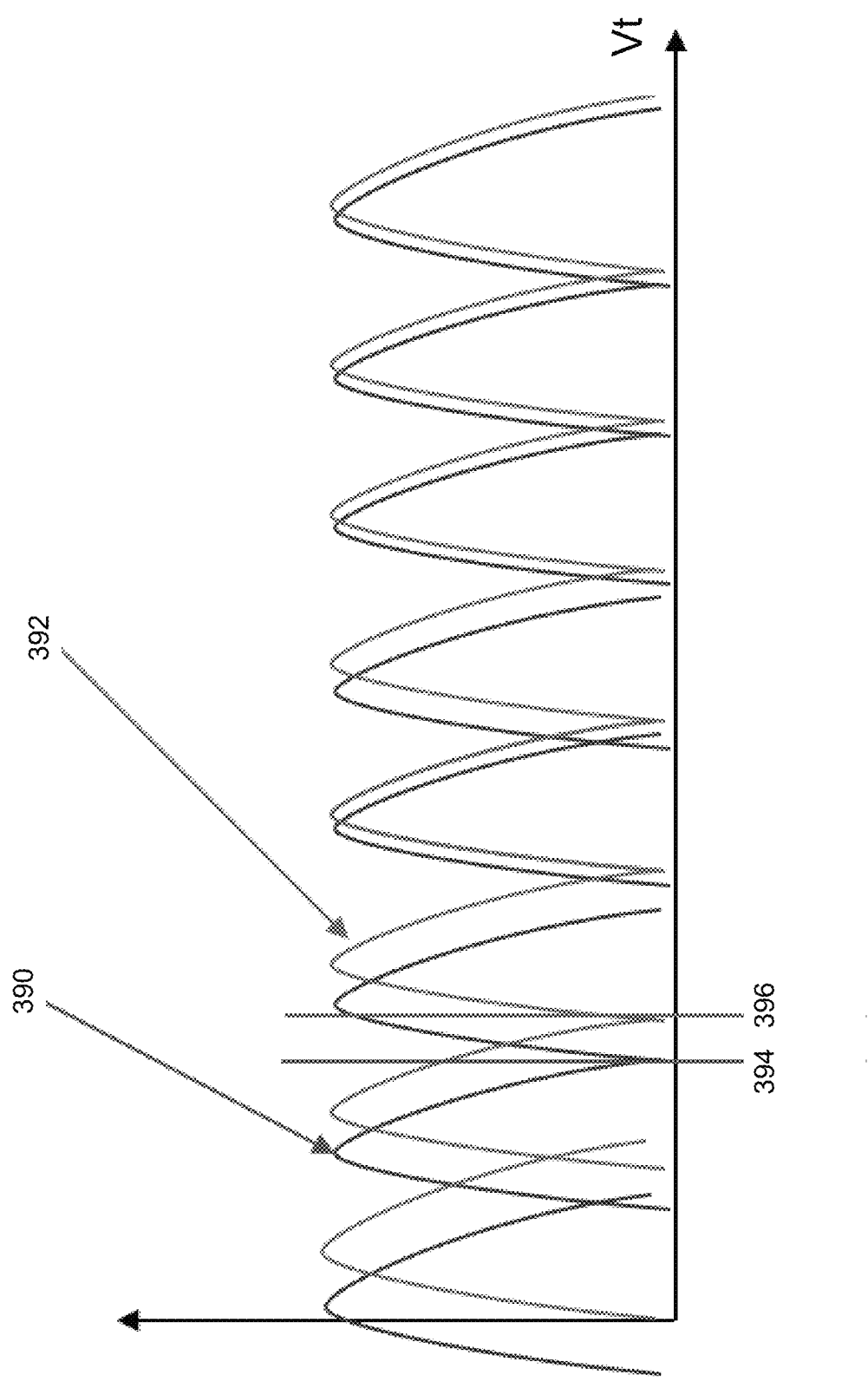
FIG. 3B is a diagram of the voltage shift across an array of memory cells.

FIG. 3B illustrates the read voltage threshold distribution and shift differences across an array of memory cells between erase blocks that are programmed/written and/or read at different temperatures. For instance, as illustrated in FIG. 3B, the read voltage threshold shift distributions 390 of a first erase block or other region written/programmed and/or read at one temperature are shifted a different amount than the read voltage threshold shift distributions 392 of a second erase block or other region written/programmed and/or read at a different temperature. Furthermore, in certain embodiments, lower voltage states 394, e.g., voltage states towards the left of the graph depicted in FIG. 3B, the first erase block or other region tend to have larger read voltage threshold shifts than lower voltage states 396 for the second erase block or other region. Due to the differences in read voltage threshold shifts between the different regions of memory, a static or fixed read voltage shift table may not be sufficient to correct or compensate for the read voltage threshold shifts. However, the voltage determination component 150, in some embodiments, dynamically determines the read voltage threshold shifts based on write/program and/or read temperatures per block or other region, to compensate for the read voltage shift differences.

Figure 4:
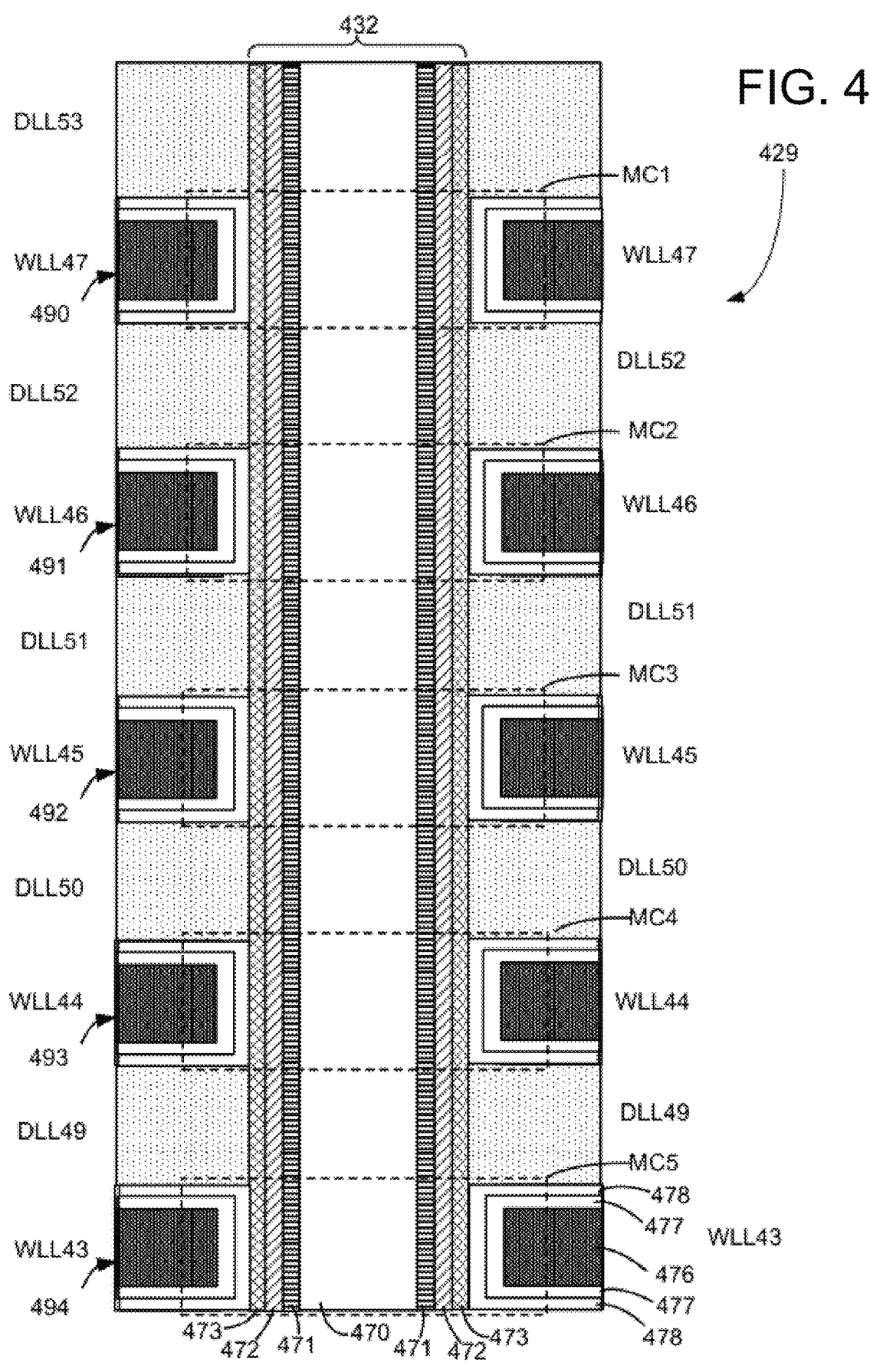
FIG. 4 is a schematic block diagram illustrating one embodiment of a three-dimensional (3D), vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge-trapping layer 473, such as (for example) Silicon Nitride. Other materials and/or structures can also be used. That is, the technology discussed herein is not limited to any particular material and/or structure.

As shown, FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge-trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge-trapping layer 473 that is associated with the memory cell. These electrons are drawn into the charge-trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Memory cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of memory cells may be part of a single string 429. In one embodiment, a single string 429 includes 48 memory cells.

Figure 5:
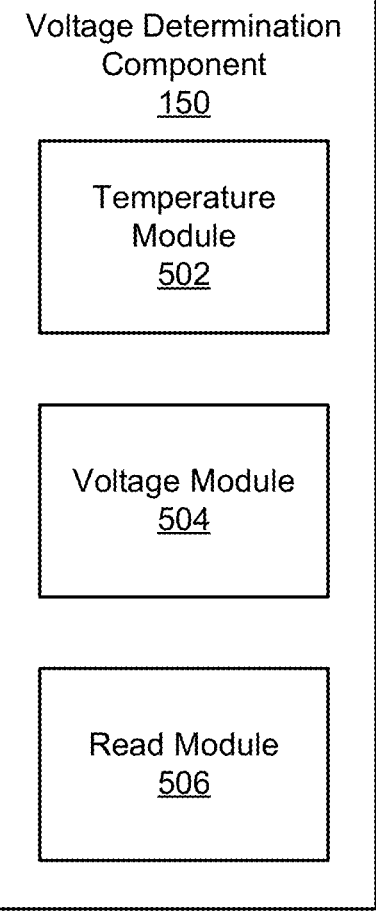
FIG. 5 is a schematic block diagram illustrating one embodiment of a voltage determination component for temperature based block reads.

FIG. 5 is a schematic block diagram illustrating one embodiment of a voltage determination component 150 for temperature based block reads. The voltage determination component 150, in one embodiment, includes one or more of a temperature module 502, a voltage module 504, and a read module 506, which are described in more detail below.

In one embodiment, the temperature module 502 is configured to sense, track, monitor, record, and/or otherwise determine write/program temperatures for at least a region of memory (e.g., a logical or physical erase block, a logical or physical page, a die, a die plane, a word line, and/or another predefined portion of a non-volatile memory medium 122). For example, in response to a write request, a write buffer being full, and/or another trigger event (e.g., data being written to a region of memory, or the like), the temperature module 502 may use a device command (e.g., a NAND B9-7C command, or the like) to sense a temperature for a non-volatile memory device 120, a die and/or die plane of a non-volatile memory medium 122, or the like including an erase block or other region of memory associated with a write/program operation. The non-volatile memory device 120, a non-volatile memory media controller 126, and/or a die of the non-volatile memory media 122 may comprise an embedded thermometer and/or other temperature sensor in communication with the temperature module 502, from which the temperature module 502 may receive temperature readings. While, in some embodiments, the temperature module 502 may determine a temperature in response to a write/program for a specific region and/or record the determined temperature for that region, a temperature reading may be for the non-volatile memory device 120 in general, for a die, for an environment of the non-volatile memory device 120, or the like.

The temperature module 502 may store, record, and/or otherwise track determined write/program temperatures for different erase blocks or other regions of the non-volatile memory medium 122 in a data structure accessible to the voltage determination component 150 and/or the non-volatile memory media controller 126, or the like. For example, the temperature module 502 may store tracked write/program temperatures in an address mapping structure such as a GAT or forward map that maps logical addresses to physical addresses, an IGAT or reverse map that maps physical addresses to logical addresses, an erase block header in the associated erase block itself, in another predefined location in the non-volatile memory medium 122, in volatile memory of the non-volatile memory media controller 126, in volatile memory 112 of the host computing device 110, or the like. For example, in some embodiments, an IGAT or other reverse map may include metadata entries for each erase block and/or other region of the non-volatile memory medium 122 (e.g., in a table, in a tree, and/or in another data structure), and the temperature module 502 may store write/program temperatures for erase blocks and/or other regions into the metadata entries for the associated erase blocks and/or other regions as they are programmed.

The temperature module 502 may cache the IGAT or other data structure storing write/program temperatures, in some embodiments, in volatile memory of the non-volatile memory media controller 126 and/or volatile memory 112 of the host computing device 110, so that the write/program temperatures may be accessed without a read operation from the non-volatile memory media 122, or the like. In certain embodiments, the non-volatile memory device 120 and/or the host computing device 110 may have limited volatile memory (e.g., in an embedded environment, on a USB device, as a memory card, or the like) and the temperature module 502 may minimize an amount of metadata stored in the IGAT or other data structure, while still tracking write/program temperatures per erase block or other region of memory.

For example, in one embodiment, the temperature module 502 may only store a single write/program temperature per erase block or other region, without storing any other temperatures for the same erase block or other region (e.g., changes in temperature over time, periods of time at specific temperatures or temperature ranges, or the like). In a further embodiment, the temperature module 502 may store write/program temperatures without any time indicator such as a timestamp and/or time period associated with a write/program temperature, or the like (e.g., storing a single write/program temperature per erase block or other region of memory at a time, and replacing the single write/program temperature each time the erase block or other region of memory is programmed, without any time indicators for multiple temperatures, or the like).

The temperature module 502, in some embodiments, is configured to sense and/or otherwise determine a read temperature for at least a region of memory (e.g., a logical or physical erase block, a logical or physical page, a die, a die plane, a word line, and/or another predefined portion of a non-volatile memory medium 122) in response to a read request for the region of memory. For example, in response to a read request and/or another trigger event, the temperature module 502 may use a device command (e.g., a NAND B9-7C command, or the like) to sense a temperature for a non-volatile memory device 120, a die and/or die plane of a non-volatile memory medium 122, or the like including an erase block or other region of memory associated with the read request (e.g., using an embedded thermometer and/or other temperature sensor of the non-volatile memory device 120, a non-volatile memory media controller 126, and/or a die of the non-volatile memory media 122, or the like. While, in some embodiments, the temperature module 502 may determine a temperature in response to a read request for a specific erase block or other region of memory, a temperature reading may be for the non-volatile memory device 120 in general, for a die, for an environment of the non-volatile memory device 120, or the like. The temperature module 502, in one embodiment, may provide a read temperature and/or a write/program temperature to the voltage module 504 (e.g., in response to a read request, or the like) for the voltage module 504 to determine a read voltage threshold based on the read temperature and/or the write/program temperature, or the like.

In one embodiment, the voltage module 504 is configured to dynamically determine a read voltage threshold for an erase block or other region of memory in response to a read request and/or another trigger event (e.g., based on a read temperature and/or a write/program temperature, or the like). The voltage module 504, in some embodiments, may look up and/or otherwise reference a read voltage threshold, a read voltage threshold shift (e.g., an offset from a default read voltage threshold value), or the like based on both a write/program temperature for an erase block or other region of memory and a read temperature for the erase block or other region of memory.

For example, the voltage module 504 may store, maintain, reference, and/or otherwise access an at least two dimensional data structure (e.g., a table, an array, a database, or the like) storing read voltage thresholds, read voltage threshold shifts, or the like indexed by at least write/program temperatures and read temperatures (e.g., so that the voltage module 504 may lookup and/or otherwise determine a read voltage threshold based on a write/program temperature and a read temperature, or the like). Such a data structure, in some embodiments, may comprise a reference table, or the like.

The voltage module 504, in one embodiment, may store a data structure comprising read voltage thresholds, read voltage threshold shifts, or the like (e.g., a reference table) in a location accessible to the voltage determination component 150, the non-volatile memory media controller 126, or the like, such as in a configuration file for the non-volatile memory media controller 126, a predefined configuration area of the non-volatile memory medium 122, cached in volatile memory of the non-volatile memory media controller 126, or the like.

The reference table or other data structure of read voltage thresholds, read voltage threshold shifts, or the like, in some embodiments, may be predefined and/or hard coded (e.g., based on a characterization or other analysis of the non-volatile memory media 122, by a manufacturer, during testing of the non-volatile memory device 120, or the like). The voltage module 504, in a further embodiment, may determine read voltage thresholds, read voltage threshold shifts, or the like with which to populate the data structure in the background, during a calibration process, or the like performing test reads.

The read module 306, in one embodiment, is configured to perform a read operation for an erase block or other region of memory (e.g., for a page, word line, or other portion of the erase block) using a determined read voltage threshold from the voltage module 504. For example, the read module 306 may apply a read voltage threshold shift and/or offset from the voltage module 504 to a default read voltage threshold, and perform a read operation using the shifted and/or offset read voltage threshold.

FIG. 6 depicts one embodiment of a reference table 600. In the depicted embodiment, the reference table 600 includes read voltage threshold shifts 606 (e.g., offsets from default read voltage thresholds), indexed by both write/program temperature ranges 602 and read temperature ranges 604.

As described above, in certain embodiments, a temperature module 502 may sense or otherwise determine write/program temperatures 602 for erase blocks or other regions of memory at program time, and in response to a read request for an erase block or other region of memory, may sense or otherwise determine a read temperature 604. The voltage module 504 may lookup a read voltage threshold shift 606 based on both a write/program temperature 602 and a read temperature 604 using the reference table 600. The reference table 600 may be stored in a configuration file for a controller 126, hard coded into a controller 126, cached in volatile memory of a controller 126, or the like.

Figure 7:
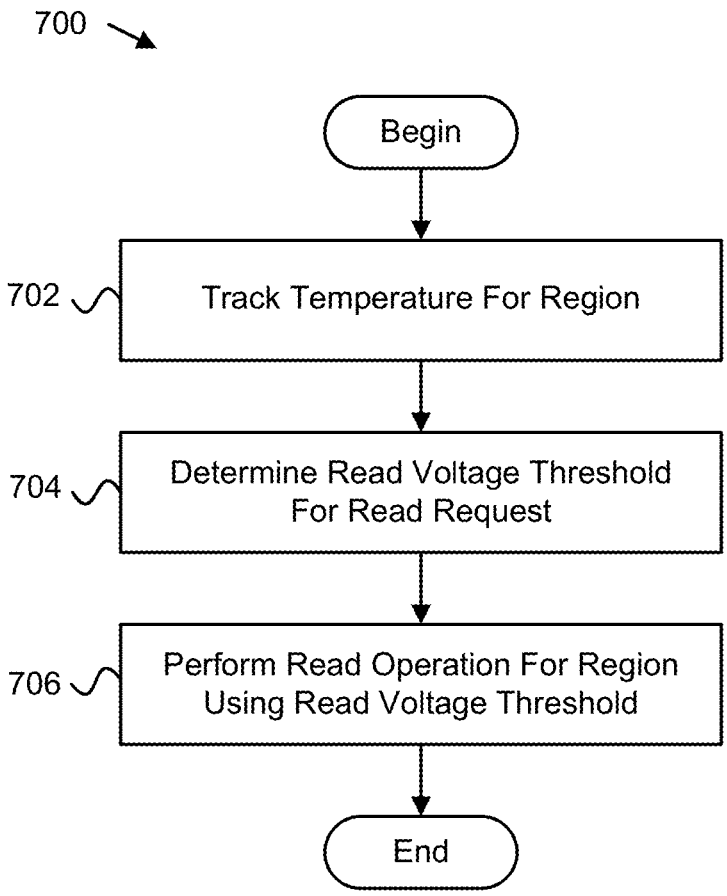
FIG. 7 is a schematic flow chart diagram illustrating one embodiment of a method for temperature based block reads.

FIG. 7 depicts one embodiment of a method 700 for temperature based block reads. The method 700 begins and a temperature module 502 tracks 702 a temperature for a region of an array of non-volatile memory cells in response to data being written to the region. A voltage module 504 determines 704 a read voltage threshold for a read request for the region based on both the tracked 702 temperature for the region and a temperature determined for the region in response to the read request. A read module 506 performs 706 a read operation for the region using the determined 704 read voltage threshold and the method 700 ends.

Figure 8:
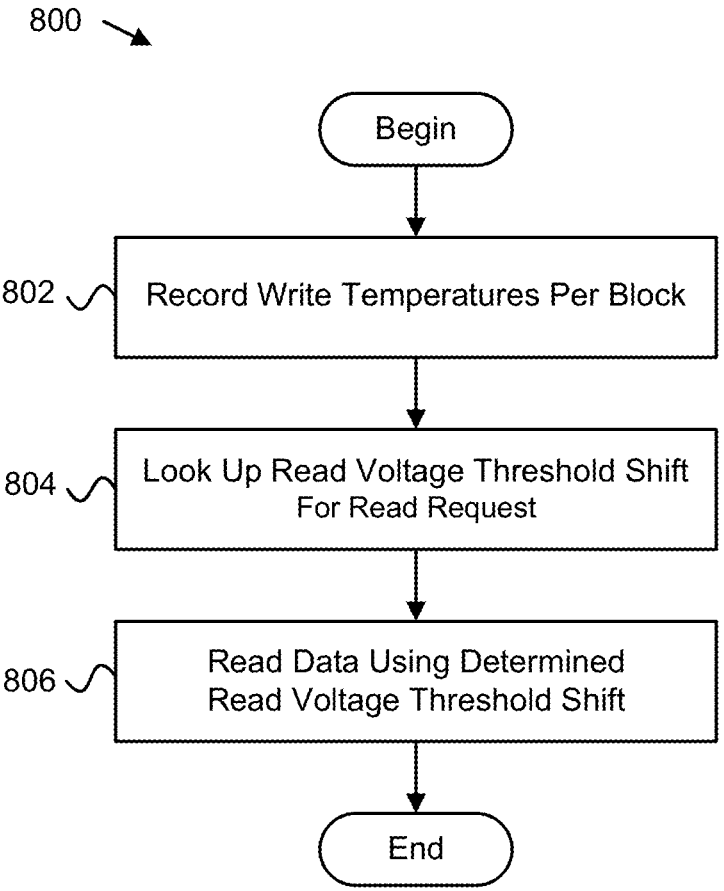
FIG. 8 is a schematic flow chart diagram illustrating another embodiment of a method for temperature based block reads.

FIG. 8 depicts one embodiment of a method 800 for temperature based block reads. The method 800 begins and a temperature module 502 records 802 write temperatures per block of a non-volatile memory medium as data is programmed to the non-volatile memory medium. A voltage module 504 looks up 804 a read voltage threshold shift for a read request based on both the recorded 802 write temperatures and a temperature determined in response to the read request. A read module 506 reads 806 data from the non-volatile memory medium using the read voltage threshold shift to satisfy the read request and the method 800 ends.

Figure 9:
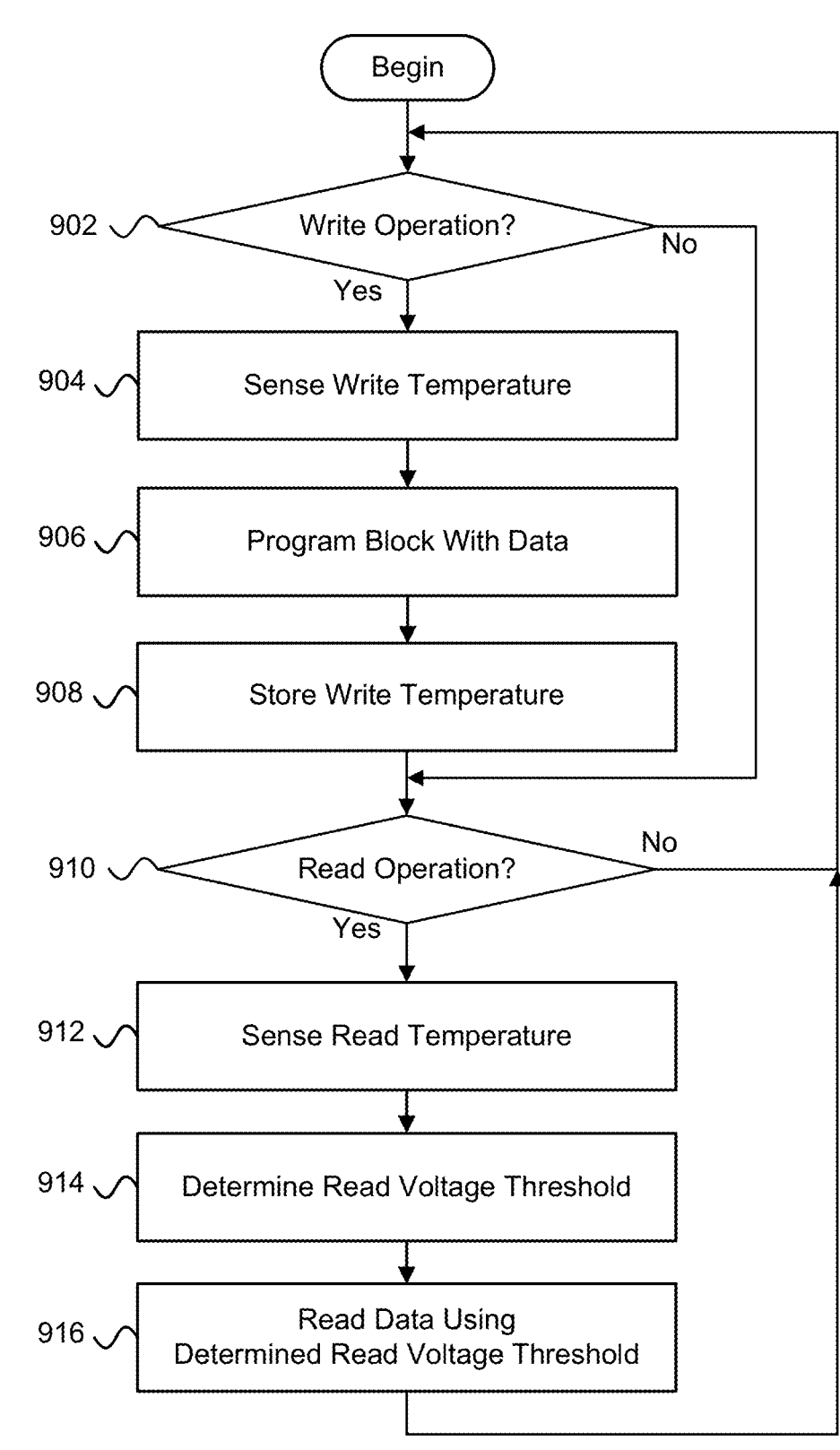
FIG. 9 is a schematic flow chart diagram illustrating a further embodiment of a method for temperature based block reads.

FIG. 9 depicts one embodiment of a method 900 for temperature based block reads. The method 900 begins and a temperature module 502 determines 902 whether to perform a write operation for an erase block or other region of memory. If the temperature module 502 determines 902 to perform a write operation, the temperature module 502 senses 904 a write/program temperature for the erase block or other region of memory. A controller 126 programs 906 the erase block or other region of memory with data of the write operation. The temperature module 502 stores 908 the sensed 904 write/program temperature in a reference table (e.g., in a configuration file for a controller 126, or the like).

The temperature module 502 determines 910 whether to perform a read operation for the erase block or other region of memory. If the temperature module 502 determines 910 to perform a read operation, the temperature module 502 senses 912 a read temperature for the erase block or other region of memory. A voltage module 504 determines 914 a read voltage threshold for the read operation based on both the sensed 904 write/program temperature and the sensed 912 read temperature. A read module 506 reads 916 data from the erase block or other region of memory using the determined 914 read voltage threshold and the method 900 continues with the temperature module 502 continuing to monitor 902, 910 for subsequent write and/or read operations.

Means for sensing write temperatures for a non-volatile memory, in various embodiments, may include one or more of a voltage determination component 150, a temperature module 502, a controller 126, a die controller 220, a thermometer or other temperature sensor, a die, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for sensing write temperatures for a non-volatile memory.

Means for sensing a read temperature for a non-volatile memory in response to a read request, in various embodiments, may include one or more of a voltage determination component 150, a temperature module 502, a controller 126, a die controller 220, a thermometer or other temperature sensor, a die, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for sensing a read temperature for a non-volatile memory in response to a read request.

Means for determining a read voltage threshold for a read request based on both a sensed write temperature and a sensed read temperature, in various embodiments, may include one or more of a voltage determination component 150, a voltage module 504, a controller 126, a die controller

220, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for determining a read voltage threshold for a read request based on both a sensed write temperature and a sensed read temperature.

Means for reading data from a non-volatile memory using a determined read voltage threshold, in various embodiments, may include one or more of a voltage determination component 150, a read module 506, a controller 126, a die controller 220, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for reading data from a non-volatile memory using a determined read voltage threshold.

Means for storing sensed write temperatures in an inverted global address table without any time indicators associated with the sensed write temperatures, the sensed write temperatures comprising a single write temperature stored in the inverted global address table per block of the non-volatile memory, in various embodiments, may include one or more of a voltage determination component 150, a temperature module 502, a controller 126, a die controller 220, a thermometer or other temperature sensor, a die, a host computing device 110, a device driver, a controller (e.g., a device driver, or the like) executing on a host computing device 110, a processor 111, an FPGA, an ASIC, a volatile memory, a non-volatile memory, other logic hardware, and/or other executable code stored on a computer-readable storage medium. Other embodiments may include similar or equivalent means for storing sensed write temperatures in an inverted global address table.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. An apparatus, comprising:
an array of non-volatile memory cells; and
a controller configured to:
   track a temperature for a region of the array of non-volatile memory cells in response to data being written to the region;
   determine a read voltage threshold shift for a read request for the region based, at least in part, on:
   the tracked temperature for the region; and
   a determined temperature of the region at a time at which the read request is received, the read voltage threshold shift being stored in a two-dimensional data structure indexed by:

the tracked temperature for the region; and
   the determined temperature of the region; and
   perform a read operation for the region using the determined read voltage threshold shift.

2. The apparatus of claim 1, wherein the data structure is stored in a configuration file for the controller.

3. The apparatus of claim 1, wherein the read voltage threshold shift comprises an offset from a default read voltage threshold value.

4. The apparatus of claim 1, wherein the tracked temperature for the region is stored in an address mapping structure for the region.

5. The apparatus of claim 4, wherein the address mapping structure comprises an inverted global address table mapping physical addresses of the array of non-volatile memory cells to logical addresses.

6. The apparatus of claim 4, wherein the address mapping structure is cached in volatile memory for the controller.

7. The apparatus of claim 4, wherein the tracked temperature for the region is stored in the address mapping structure without any other temperatures for the same region.

8. The apparatus of claim 7, wherein the tracked temperature for the region is stored in the address mapping structure without any time indicator associated with the tracked temperature.

9. The apparatus of claim 1, wherein the region comprises an erase block of the array of non-volatile memory cells.

10. A method, comprising:
recording write temperatures per block of a non-volatile memory as data is programmed to the non-volatile memory;
determining a read voltage threshold shift for a read request based, at least in part, on:
   the recorded write temperatures; and
   a temperature for a region of the non-volatile memory at which data associated with the read request is stored, the temperature for the region being determined in response to receiving the read request, wherein the read voltage threshold shift is stored in a two-dimensional data structure indexed by:
   the recorded write temperatures; and
   the temperature of the region determined in response to receiving the read request; and
reading data from the region of the non-volatile memory using the read voltage threshold shift.

11. The method of claim 10, wherein the read voltage threshold shift comprises an offset from a default read voltage threshold value.

12. The method of claim 10, wherein the recorded write temperatures are stored in an address mapping structure for the non-volatile memory.

13. The method of claim 12, wherein the address mapping structure comprises an inverted global address table mapping physical addresses of the non-volatile memory to logical addresses.

14. The method of claim 12, wherein the recorded write temperatures stored in the address mapping structure comprise a single write temperature per block of the non-volatile memory.

15. The method of claim 14, wherein the recorded write temperatures are stored in the address mapping structure without any time indicators associated with the recorded write temperatures.

16. An apparatus comprising:
means for sensing write temperatures for a non-volatile memory;

means for sensing a read temperature for the non-volatile memory in response to a read request;

means for determining a read voltage threshold for the read request based on both the sensed write temperatures and the sensed read temperature; and means for reading data from the non-volatile memory using the determined read voltage threshold.

17. The apparatus of claim 16, further comprising means for storing the sensed write temperatures in an inverted global address table without any time indicators associated with the sensed write temperatures, the sensed write temperatures comprising a single write temperature stored in the inverted global address table per block of the non-volatile memory.

18. The apparatus of claim 16, wherein the means for determining the read voltage threshold comprises a two-dimensional data structure indexed by the sensed write temperatures and the sensed read temperature.

19. The apparatus of claim 16, further comprising means for caching the sensed write temperatures in volatile memory to facilitate access during one or more operations.

20. The apparatus of claim 16, wherein the means for storing the sensed write temperatures comprises a configuration file that includes a single write temperature per block of the non-volatile memory.

* * * * *